US008831059B2

(12) United States Patent
Nogami et al.

(10) Patent No.: US 8,831,059 B2
(45) Date of Patent: Sep. 9, 2014

(54) LASER DIODE DRIVER CIRCUIT

(75) Inventors: Masamichi Nogami, Tokyo (JP);
Satoshi Yoshima, Tokyo (JP); Junichi Nakagawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/983,879

(22) PCT Filed: Feb. 7, 2011

(86) PCT No.: PCT/JP2011/052561
§ 371 (c)(1),
(2), (4) Date: Aug. 6, 2013

(87) PCT Pub. No.: WO2012/107994
PCT Pub. Date: Aug. 16, 2012

(65) Prior Publication Data
US 2013/0308669 A1 Nov. 21, 2013

(51) Int. Cl.
*H01S 5/00* (2006.01)
*H01S 5/042* (2006.01)
*H04B 10/50* (2013.01)
*H01S 5/062* (2006.01)

(52) U.S. Cl.
CPC ............ *H01S 5/0085* (2013.01); *H01S 5/0427* (2013.01); *H01S 5/06226* (2013.01); *H04B 10/504* (2013.01)
USPC .................................... 372/38.07; 372/38.02

(58) Field of Classification Search
CPC .... H01S 5/0261; H01S 5/0427; H01S 5/0428
USPC ...................................................... 372/38.07
See application file for complete search history.

(56) References Cited

U.S. PATENT DOCUMENTS

| 7,068,691 B2 | 6/2006 | Chujo et al. | |
| 2009/0238226 A1* | 9/2009 | Moto et al. | 372/38.02 |
| 2010/0183318 A1 | 7/2010 | Tanaka | |

FOREIGN PATENT DOCUMENTS

| JP | 03 024831 | 2/1991 |
| JP | 06 013658 | 1/1994 |
| JP | 07 240551 | 9/1995 |
| JP | 07 273388 | 10/1995 |
| JP | 11 145914 | 5/1999 |
| JP | 2004 273631 | 9/2004 |

(Continued)

OTHER PUBLICATIONS

International Search Report Issued Mar. 15, 2011 in PCT/JP11/052561 Filed Feb. 7, 2011.

*Primary Examiner* — Xinning Niu
(74) *Attorney, Agent, or Firm* — Oblon, Spivak, McClelland, Maier & Neustadt, L.L.P.

(57) ABSTRACT

A laser diode drive circuit includes a laser diode (LD), a modulation-current differential drive circuit, a bias-current differential drive circuit, a first inductance connected between an anode of the LD and a positive power source, a second inductance connected between a cathode of the LD and a negative-phase output terminal of the bias-current differential drive circuit, a first resistor connected to a connection point of the anode of the LD and the first inductance and connected to a negative-phase output terminal of the modulation-current differential drive circuit, and a second resistor connected to a connection point of the cathode of the LD and the second inductance and connected to a positive-phase output terminal of the modulation-current differential drive circuit, and a positive-phase output terminal of the bias-current differential drive circuit is connected to the connection point.

12 Claims, 19 Drawing Sheets

(56) References Cited

FOREIGN PATENT DOCUMENTS

| | | |
|---|---|---|
| JP | 2007 103668 | 4/2007 |
| JP | 2008 041907 | 2/2008 |
| JP | 2009 099803 | 5/2009 |
| JP | 2009 158849 | 7/2009 |
| JP | 2010 171062 | 8/2010 |

* cited by examiner

LASER DIODE DRIVER CIRCUIT

FIELD

The present invention relates to a laser diode driver circuit that is provided in a transmission unit of a subscriber terminal apparatus (ONU: Optical Network Unit) of a PON (Passive Optical Network) system that is one of access optical communication systems.

BACKGROUND

A point-to-multipoint access optical communication system referred to as "PON system" has been widely used as a method for implementing a public line network that employs optical fibers.

The PON system is constituted by an OLT (Optical Line Terminal) as a station-side apparatus and a plurality of ONUs that serve as a plurality of subscriber terminal apparatuses connected to the OLT via an optical star coupler. Because a number of ONUs can share the OLT and most part of the optical fibers configuring transmission paths, reduction of the operation cost can be expected, and because the optical star coupler, which is a passive component, does not need a power supply and can be easily installed outside, there is another advantage of high reliability. Accordingly, the PON system has been recently actively introduced as a key technology for implementing broadband networks.

For example, in a GE-PON (Gigabit Ethernet®-Passive Optical Network) having a transmission speed of 1.25 Gbit/s, which is standardized compliant with the IEEE802.3ah, a downstream from an OLT to ONUs employs a broadcast communication system using an optical wavelength band of 1.49 micrometers and each of the ONUs retrieves only the data addressed to itself in an allocated time slot. On the other hand, an upstream from each of the ONUs to the OLT uses an optical wavelength band of 1.31 micrometers and employs a time-division multiplex communication system for controlling transmission timing such that data from the ONUs do not collide with each other.

In the upstream communication of the PON system described above, an optical transmission unit in each of the ONUs generates an upstream burst optical data signal according to each transmission timing. In order to generate the burst optical data signal at a high speed, differential driving of a semiconductor laser diode (LD) is effective. For example, Patent Literature 1 proposes a technique related to differential driving of an LD.

CITATION LIST

Patent Literature

Patent Literature 1: Japanese Patent Application Laid-open No. 2008-41907

SUMMARY

Technical Problem

However, in the technique disclosed in Patent Literature 1 mentioned above, when a bias current is supplied to an LD in a burst manner, a reverse voltage is generated due to an inductance connected between a positive power source and the anode of the LD for implementing the differential driving of the LD. This decreases an output potential of a bias-current drive circuit to close to a negative power source, generating a time for which an output transistor in the bias-current drive circuit is switched OFF. Due to this operation, because a predetermined time is required from the time at which the bias current is started to flow until a set current is supplied, there has been a problem that a burst emission is delayed and the transmission efficiency is degraded.

The present invention has been achieved in view of the above problems, and an object of the present invention is to provide a laser diode driver circuit (hereinafter, "LD drive circuit") that can improve the transmission efficiency of a PON system.

Solution to Problem

To solve the problems and achieve the object according to an aspect of the present invention, a laser diode driver circuit includes: a laser diode that converts a current signal into an optical signal; a bias-current drive circuit that supplies a bias current to the laser diode; a modulation-current drive circuit that supplies a modulation current to the laser diode; a first inductance connected between the anode of the laser diode and a positive power source; a second inductance connected between the cathode of the laser diode and a negative-phase output terminal of the bias-current drive circuit; a first resistor with one end connected to a connection point of the anode of the laser diode and the first inductance and the other end connected to a negative-phase output terminal of the modulation-current drive circuit; and a second resistor including one end connected to a connection point of the cathode of the laser diode and the second inductance and the other end connected to a positive-phase output terminal of the modulation-current drive circuit. A positive-phase output terminal of the bias-current drive circuit is connected to the connection point of the anode of the laser diode and the first inductance.

Advantageous Effects of Invention

According to the present invention, because a positive-phase output terminal of a bias-current drive circuit is connected to a connection point between the anode of an LD and a first inductance, the transmission efficiency of a PON system can be improved.

DESCRIPTION OF EMBODIMENTS

Exemplary embodiments of an LD drive circuit according to the present invention will be explained below in detail with reference to the accompanying drawings. The present invention is not limited to the embodiments.

First Embodiment

Figure 1:
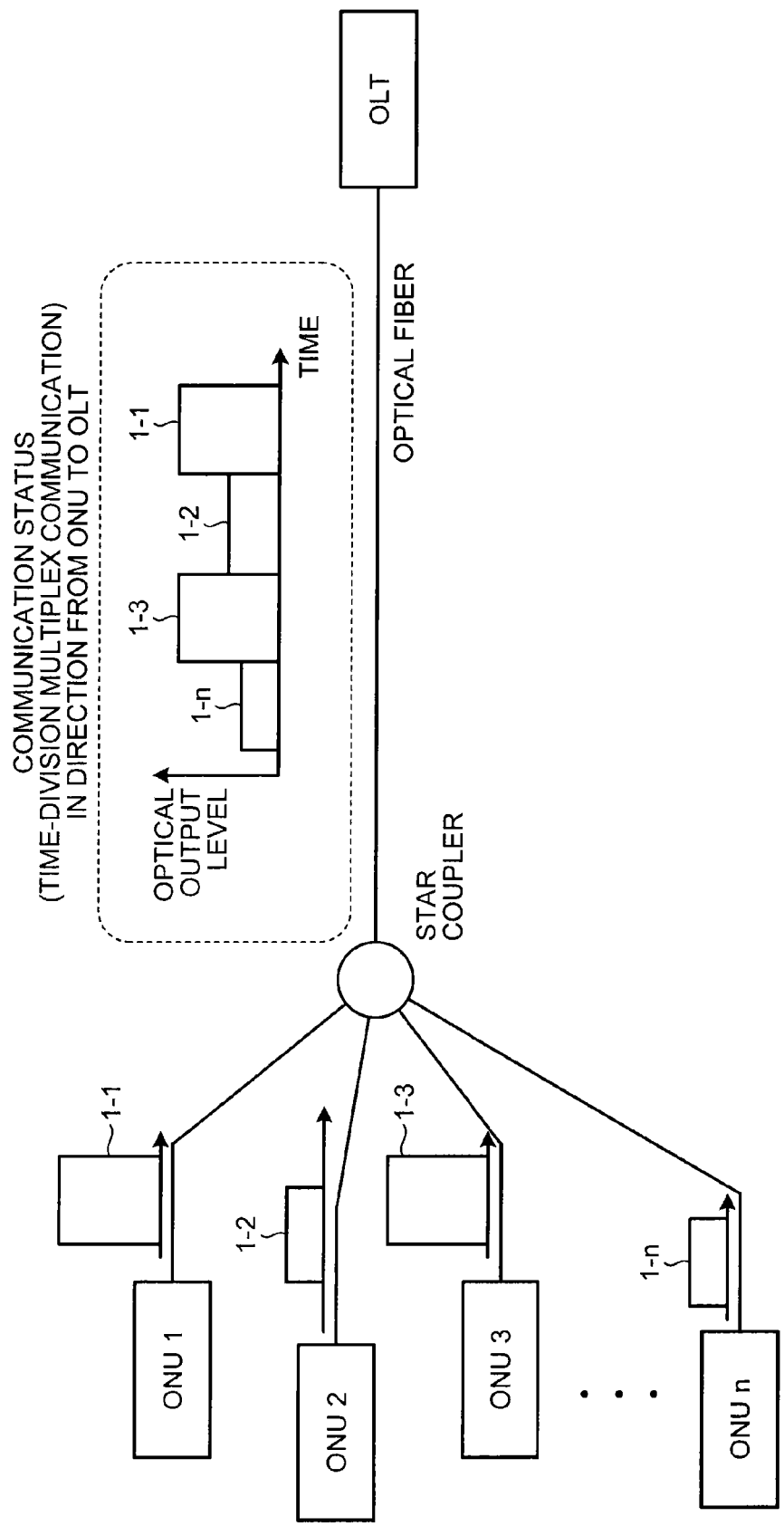
FIG. 1 depicts a configuration of a general PON system.

FIG. 1 depicts a configuration of a general PON system. The PON system includes an OLT as s station-side apparatus and a plurality of subscriber terminal apparatuses ONU1 to ONUn connected to the OLT via an optical star coupler. In the PON system, because an access method in an upstream channel from the ONU1 to ONUn to the OLT is defined as a time-division multiplex method, packets 1-1 to 1-*n* are intermittently transmitted from the ONU1 to ONUn to the OLT. Timings at which the ONU1 to ONUn respectively transmit the packets 1-1 to 1-*n* are adjusted such that the packets 1-1 to 1-*n* are not overlapped in an optical receiver (not shown) of the OLT. Furthermore, because each of the distances from the OLT to the ONU1 to ONUn is different from each other, as shown in the uppermost part of FIG. 1, optical intensities of the packets 1-1 to 1-*n* received by the optical receiver of the OLT are different from each other. An LD drive circuit according to a first embodiment is applied to the ONU1 to ONUn, and the configuration and operations thereof are explained below in detail.

Figure 2:
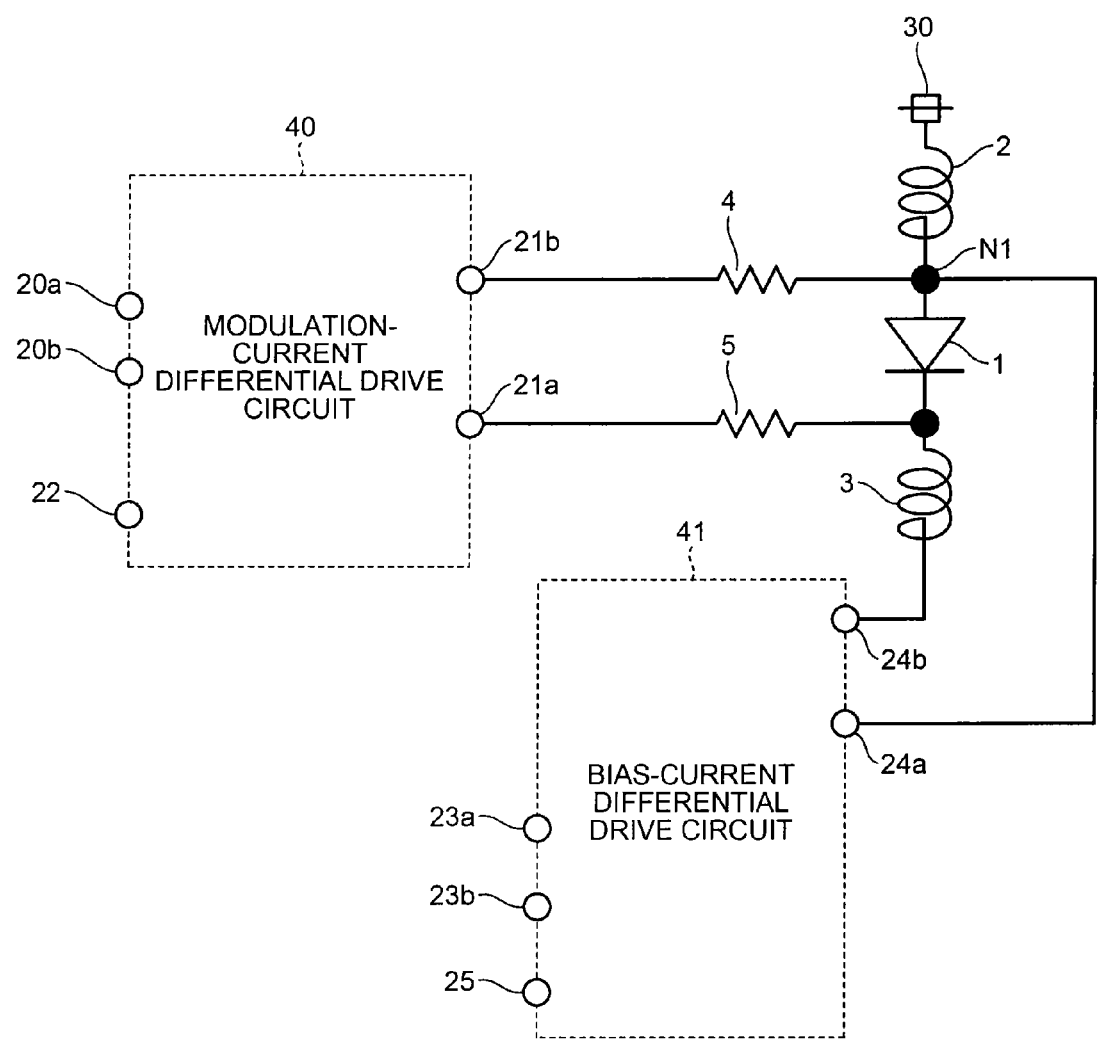
FIG. 2 depicts a configuration of an LD drive circuit according to a first embodiment of the present invention.
Figure 3:
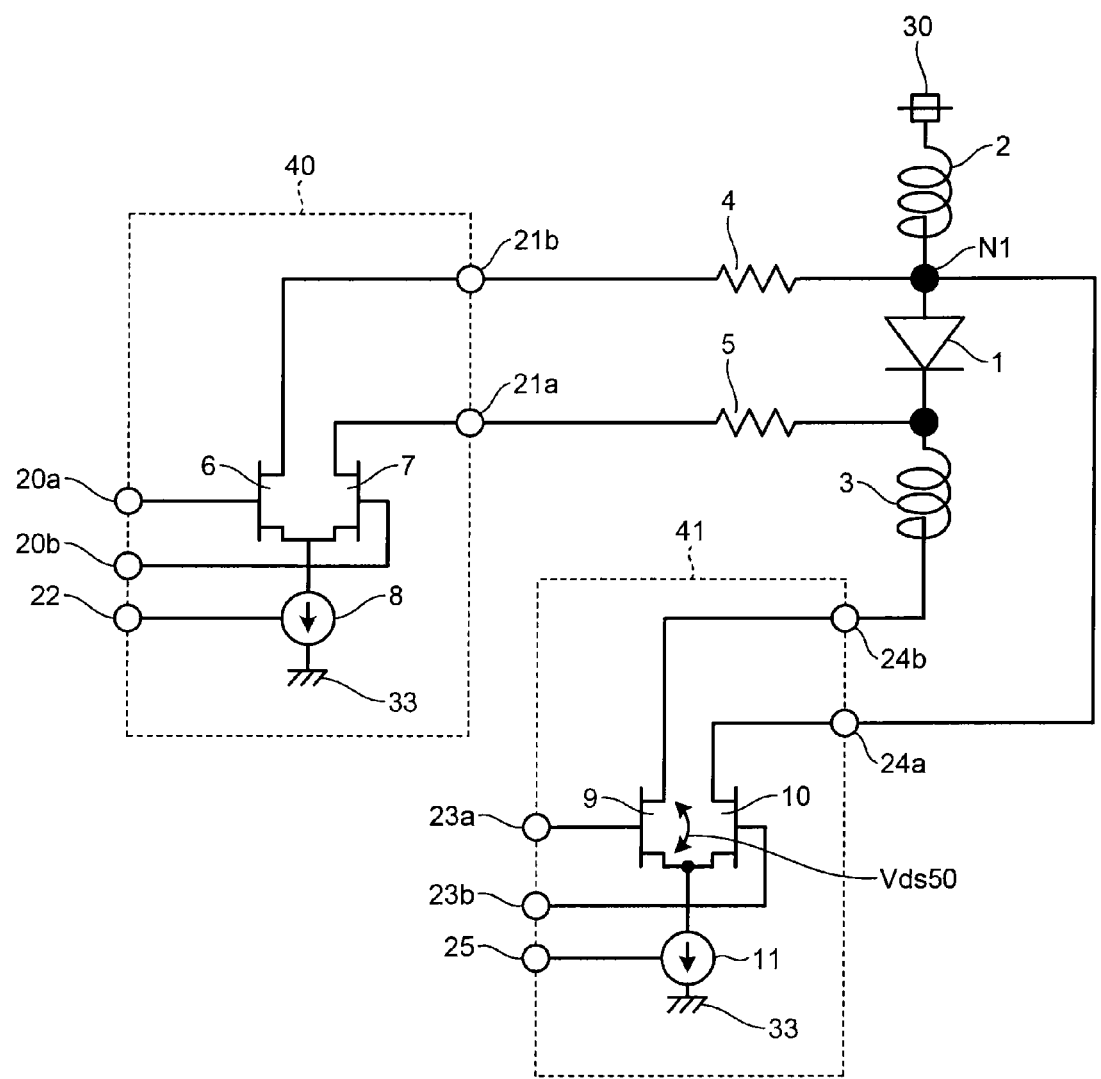
FIG. 3 depicts a reference example of a modulation-current differential drive circuit and a bias-current differential drive circuit shown in FIG. 2.

FIG. 2 depicts a configuration of the LD drive circuit according to the first embodiment of the present invention, and FIG. 3 depicts a reference example of a modulation-current differential drive circuit (hereinafter, "modulation-current drive circuit") 40 and a bias-current differential drive circuit (hereinafter, "bias-current drive circuit") 41 shown in FIG. 2.

In FIG. 2, the LD drive circuit according to the first embodiment includes, as a main configuration, an LD 1 that converts a current signal into an optical signal, the bias-current drive circuit 41 that supplies a burst-like bias current to the LD 1, the modulation-current drive circuit 40 that supplies a modulation current to the LD 1 by superimposing the modulation current on the bias current, a first inductance 2 connected between the anode side of the LD 1 and a positive power source 30, a second inductance 3 connected between the cathode side of the LD 1 and a negative-phase output terminal 24b of the bias-current drive circuit 41, a first resistor 4 with one end connected to a connection point N1 between the anode of the LD 1 and the first inductance 2 (hereinafter, simply "connection point N1") and the other end connected to a negative-phase output terminal 21b of the modulation-current drive circuit 40, and a second resistor 5 with one end connected to a connection point between the cathode of the LD 1 and the second inductance 3 and the other end connected to a positive-phase output terminal 21a of the modulation-current drive circuit 40.

Furthermore, in the LD drive circuit according to the first embodiment, a positive-phase output terminal 24a of the bias-current drive circuit 41 is connected to the connection point N1.

The modulation-current drive circuit 40 includes the positive-phase output terminal 21a and the negative-phase output terminal 21b, and further includes modulation-voltage-signal input terminals 20a and 20b and a modulation-current setting terminal 22. The positive-phase output terminal 21a and the negative-phase output terminal 21b function as differential-current-signal output terminals of the modulation-current drive circuit 40. Two complementary input signals (burst signals) are respectively input to the modulation-voltage-signal input terminals 20a and 20b.

The bias-current drive circuit 41 includes the positive-phase output terminal 24a and the negative-phase output terminal 24b, and further includes differential-voltage-signal input terminals 23a and 23b and a bias-current setting terminal 25. Two complementary input signals are respectively input to the differential-voltage-signal input terminals 23a and 23b. The positive-phase output terminal 24a and the negative-phase output terminal 24b function as differential-current-signal output terminals of the bias-current drive circuit 41.

The first resistor 4 and the second resistor 5 operate as damping resistors for relaxing impedance mismatch between the impedance of the LD 1 and the output impedance of the modulation-current drive circuit 40. The first inductance 2 becomes high impedance when the modulation current is output from the modulation-current drive circuit 40, thus isolating the positive power source 30 in a high-frequency component isolating manner to drive the LD 1. The second inductance 3 is configured to increase an output impedance of the bias-current drive circuit 41 to prevent the modulation current from the modulation-current drive circuit 40 from flowing into the bias-current drive circuit 41.

As shown in FIG. 3, the modulation-current drive circuit 40 includes a first MOS transistor 6, a second MOS transistor 7, and a current source 8 that is provided between a connection point of the source of the first MOS transistor 6 and the source of the second MOS transistor 7 and a negative power source 33 and supplies a current determined by a set value from the modulation-current setting terminal 22.

The first MOS transistor 6 and the second MOS transistor 7 constitute a differential circuit driven by the two complementary input signals. The modulation-voltage-signal input terminal 20a is connected to the gate of the first MOS transistor 6, and the negative-phase output terminal 21b is connected to the drain of the first MOS transistor 6. The modulation-voltage-signal input terminal 20b is connected to the gate of the second MOS transistor 7, and the positive-phase output terminal 21a is connected to the drain of the second MOS transistor 7. In this manner, the modulation-current drive circuit 40 is configured such that the drains of the first MOS transistor 6 and the second MOS transistor 7 respectively output a positive-phase output and a negative-phase output of the modulation-current drive circuit 40.

The bias-current drive circuit 41 includes a third MOS transistor 9, a fourth MOS transistor 10, and a current source 11 that is provided between a connection point of the source of the third MOS transistor 9 and the source of the fourth MOS transistor 10 and the negative power source 33 and supplies a current determined by a set value from the bias-current setting terminal 25.

The third MOS transistor 9 and the fourth MOS transistor 10 constitute a differential circuit driven by the two complementary input signals. The differential-voltage-signal input terminal 23a is connected to the gate of the third MOS transistor 9, and the negative-phase output terminal 24b is connected to the drain of the third MOS transistor 9. The differential-voltage-signal input terminal 23b is connected to the gate of the fourth MOS transistor 10, and the positive-phase output terminal 24a is connected to the drain of the fourth MOS transistor 10. In this manner, the bias-current drive circuit 41 is configured such that the drains of the third MOS transistor 9 and the fourth MOS transistor 10 respectively output a positive-phase output and a negative-phase output of the bias-current drive circuit 41. The reference sign "Vds50" shown in FIG. 3 indicates a drain-source voltage of the third MOS transistor 9 included in the bias-current drive circuit 41 according to the first embodiment.

Operations of the LD drive circuit according to the first embodiment of the present invention are explained below.

Figure 4:
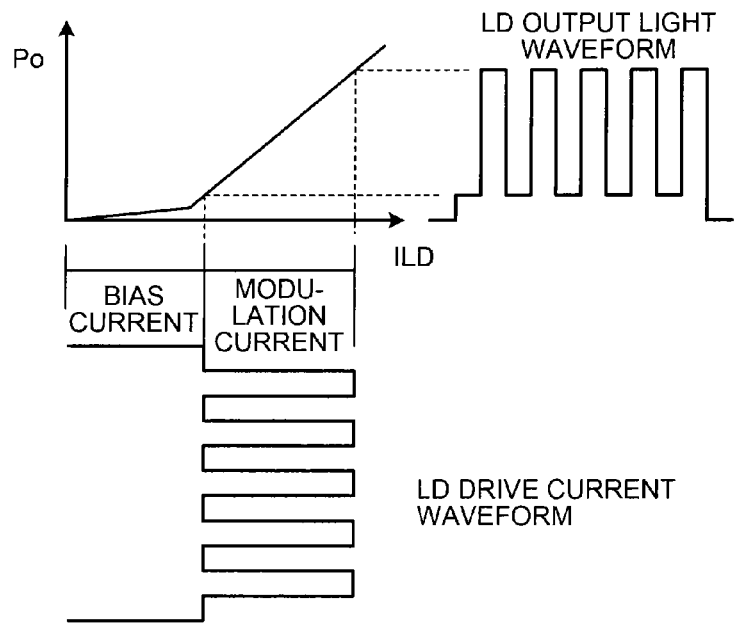
FIG. 4 is a conceptual diagram of a waveform of an LD drive current input to an LD and a waveform of LD output light.
Figure 5:
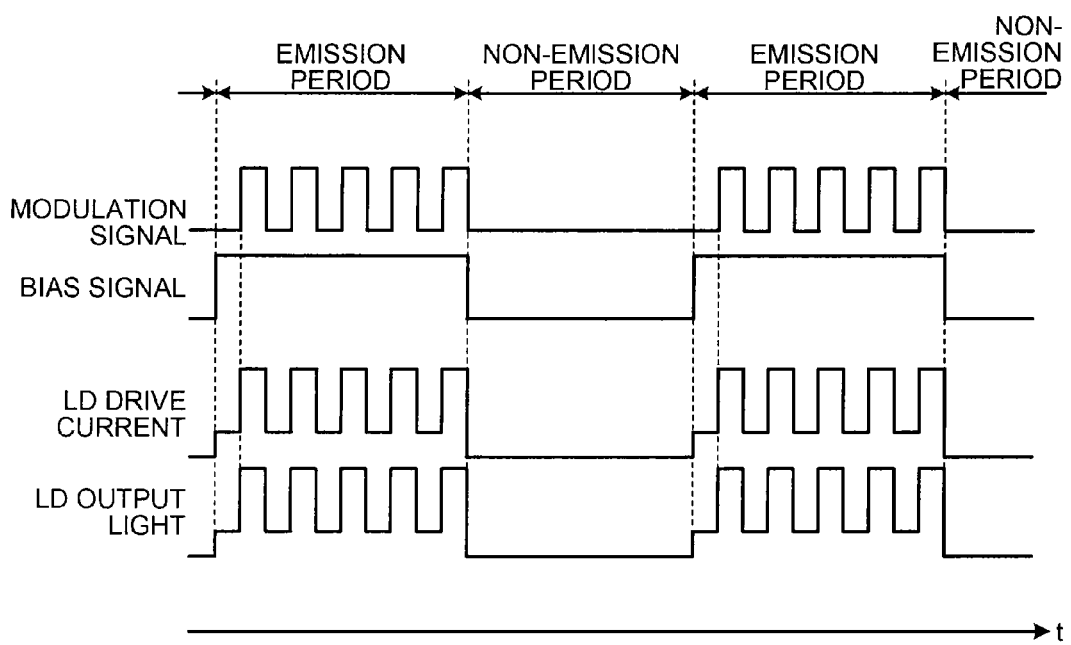
FIG. 5 depicts a relationship between a modulation signal, a bias signal, an LD drive current, and LD output light.

FIG. 4 is a conceptual diagram of a waveform of an LD drive current input to the LD 1 and a waveform of output light from the LD 1, and FIG. 5 depicts a relationship between a modulation signal, a bias signal, an LD drive current, and LD output light.

In FIG. 4, the horizontal axis represents an LD drive current (ILD), the vertical axis represents an optical power (Po) of the LD output light, and the curve line represents a characteristic curve of the LD 1. A bias current indicates a current output from the positive-phase output terminal 24a or the negative-phase output terminal 24b of the bias-current drive circuit 41, and a modulation current indicates a current output from the positive-phase output terminal 21a or the negative-phase output terminal 21b of the modulation-current drive circuit 40. The waveform of the LD drive current represents a waveform of the current in which the bias current is superimposed on the modulation current.

Because the modulation current in response to a baseband signal (burst signal) is supplied to the LD 1 by the modulation-current drive circuit 40 together with the bias current, the LD output light as shown in FIG. 4 is output from the LD 1 in response to the both currents. A bias current with which the modulation current is not distorted is required for the emission of the LD 1.

The modulation signal shown in FIG. 5 is a signal input to the modulation-voltage-signal input terminal 20a or the modulation-voltage-signal input terminal 20b, which is converted into the modulation current shown in FIG. 4 by the first MOS transistor 6 and the second MOS transistor 7 that constitute a differential pair. The bias signal shown in FIG. 5 is a signal input to the differential-voltage-signal input terminal 23a or the differential-voltage-signal input terminal 23b of the bias-current drive circuit 41, which is converted into the bias current shown in FIG. 4 by the third MOS transistor 9 and the fourth MOS transistor 10 that constitute a differential pair.

In the ONU of the PON system, because the light needs to be emitted in a burst manner, the LD drive current (the modulation current and the bias current) shown in FIG. 5 is applied to the LD 1 in a burst manner, by which the LD output light (burst light) as shown in FIG. 5 is generated from the LD 1.

In the LD drive circuit according to the present embodiment, as shown in FIG. 3, a current flowing through the first inductance 2 is not changed by connecting the positive-phase output terminal 24a of the bias-current drive circuit 41 to the connection point N1, and hence a reverse voltage caused by the first inductance 2 is suppressed. Furthermore, a back electromotive force caused by the second inductance 3 is reduced by setting values of the first inductance 2 and the second inductance 3 to satisfy a relationship of the first inductance 2>>the second inductance 3.

The effect of the LD drive circuit according to the first embodiment is explained below based on a comparison with a conventional technique.

Figure 6:
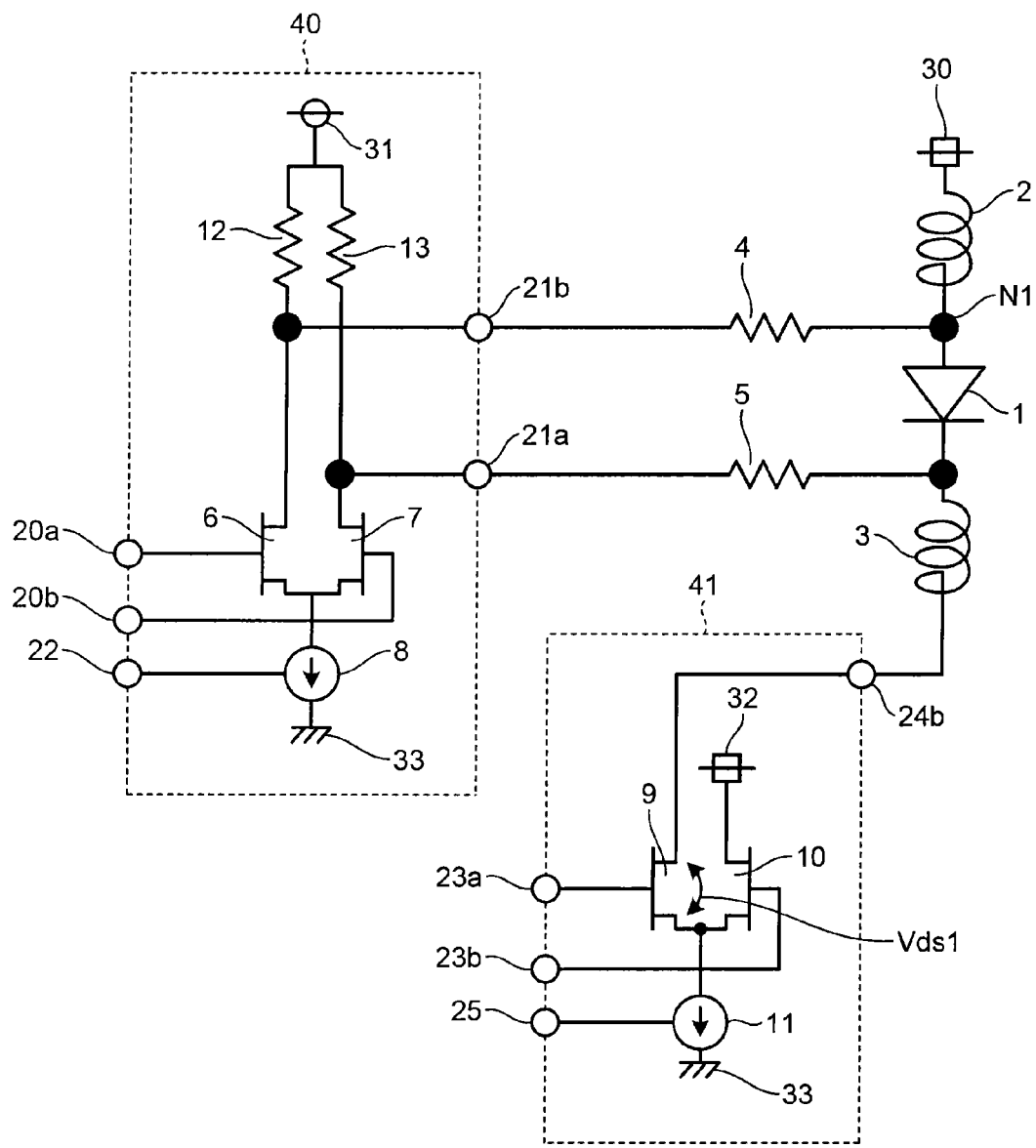
FIG. 6 depicts a configuration of a conventional LD drive circuit.
Figure 7:
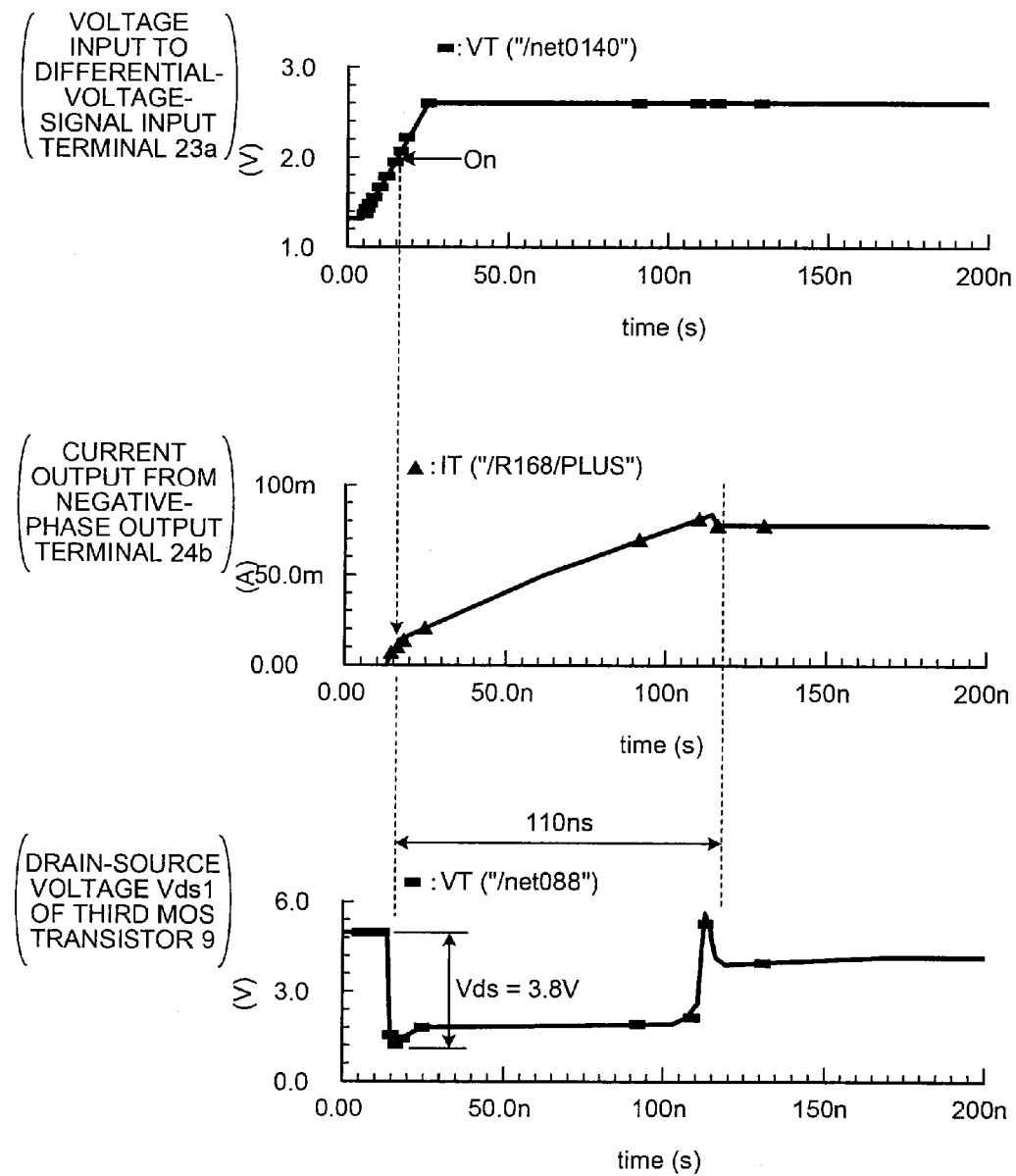
FIG. 7 depicts a simulation result obtained by using the LD drive circuit shown in FIG. 6.
Figure 8:
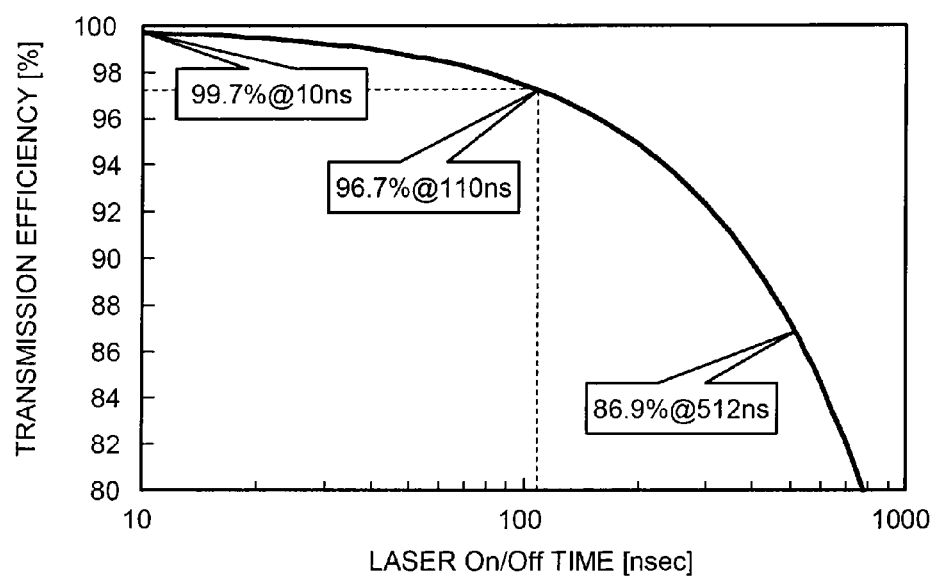
FIG. 8 depicts a stabilization time and transmission efficiency of LD output light by the LD drive circuit shown in FIG. 6.

FIG. 6 depicts a configuration of a conventional LD drive circuit, FIG. 7 depicts a simulation result obtained by using the LD drive circuit shown in FIG. 6, and FIG. 8 depicts a stabilization time and transmission efficiency of the LD output light by the LD drive circuit shown in FIG. 6.

The LD drive circuit shown in FIG. 6 is a circuit described in Patent Literature 1 mentioned above. Parts of the LD circuit that are identical to those of the LD drive circuit according to the first embodiment are denoted by same reference signs, explanations thereof will be omitted, and only different features are explained below.

The conventional drive circuit shown in FIG. 6 is different from the LD drive circuit according to the first embodiment in the following points. That is, the conventional drive circuit shown in FIG. 6 includes a fifth resistor 12 having one end connected to the first MOS transistor 6 and the other end connected to a positive power source 31 and a sixth resistor 13 having one end connected to the second MOS transistor 7 and the other end connected to the positive power source 31. Furthermore, in the conventional LD drive circuit shown in FIG. 6, the drain of the fourth MOS transistor 10 is connected to a positive power source 32. The reference sign "Vds1" shown in FIG. 6 indicates a drain-source voltage of the third MOS transistor 9 included in a conventional bias-current drive circuit 41.

A waveform of an input voltage (bias signal) to the differential-voltage-signal input terminal 23a (positive-phase input terminal) shown in FIG. 6 is shown in the uppermost chart of FIG. 7. An output current (bias current) output from the negative-phase output terminal 24b shown in FIG. 6 is shown in the middle chart of FIG. 7, and a waveform of the Vds1 shown in FIG. 6 is shown in the lowermost chart of FIG. 7.

When the input voltage shown in the uppermost chart of FIG. 7 is input to the differential-voltage-signal input terminal 23a, the output current as shown in the middle chart of FIG. 7 appears at the negative-phase output terminal 24b. The reason why a rise of the waveform of the output current shown in the middle chart of FIG. 7 is lagged is because, as shown in the lowermost chart of FIG. 7, the value of the Vds1 is greatly inversed to Vds=3.8 volts due to the back electromotive force from the first inductance 2 and the third MOS transistor 9 cannot operate during the time for which the Vds1 is inversed. The time for which the Vds1 is inversed is a time until the third MOS transistor 9 that is switched OFF by the back electromotive force becomes switched ON.

As explained above with referenced to FIGS. 4 and 5, because the bias current to the LD 1 is converted into the light waveform, a time of about 110 nanoseconds is required for the output light of the LD 1 to be stabilized, as the waveform shown in the middle chart of FIG. 7.

FIG. 8 depicts a relationship between a time for which the Vds1 is inversed and the transmission efficiency. The horizontal axis represents an On/Off time of the LD 1, and the vertical axis represents the transmission efficiency. The transmission efficiency when the time for which the Vds1 is inversed is 110 nanoseconds is 96.7%. That is, it is found that about 3.3% is wasted. Therefore, a reduction of a rise time of the LD 1 is effective in improving the transmission efficiency.

Figure 9:
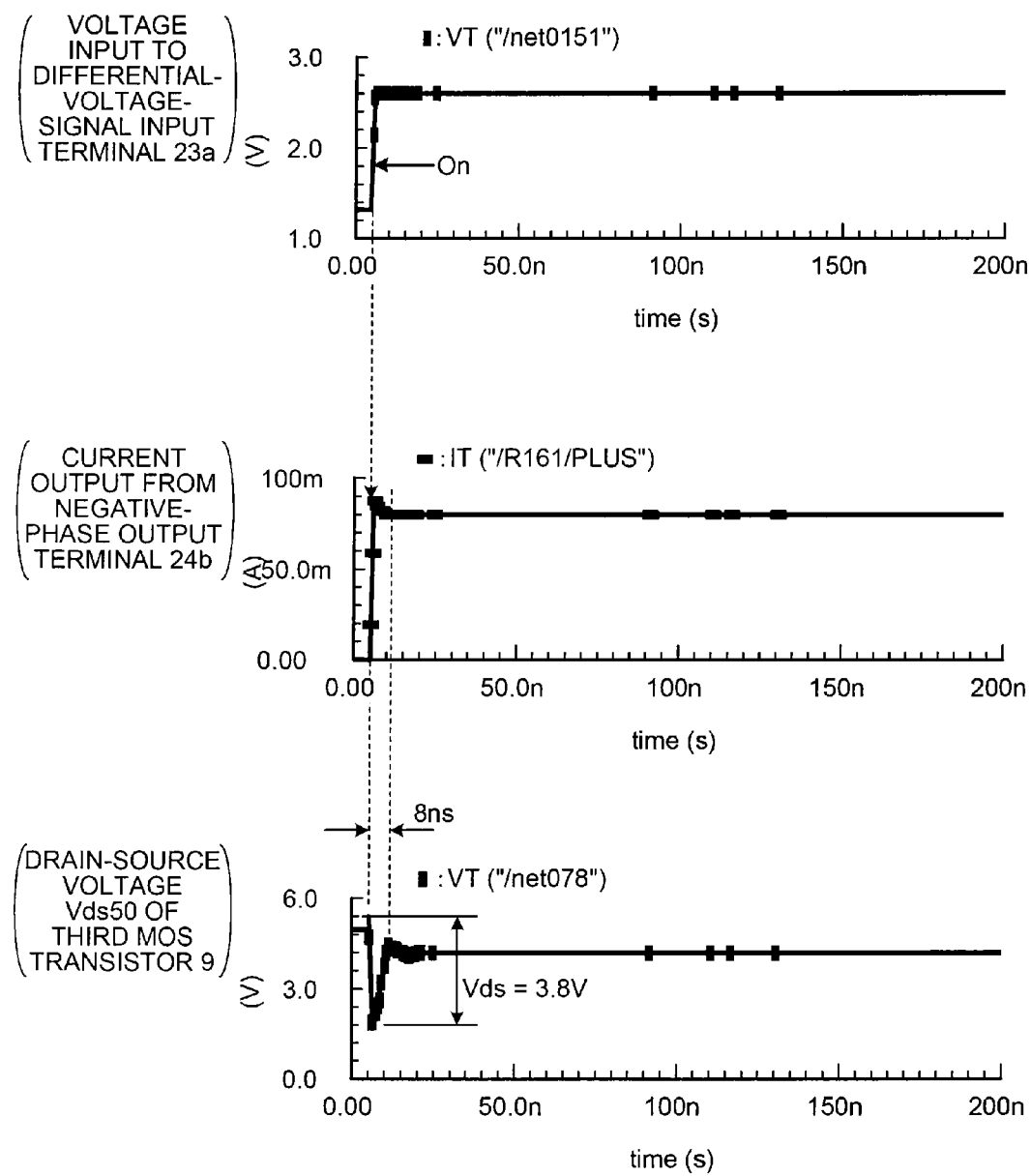
FIG. 9 depicts a simulation result obtained by using an LD drive circuit according to the first embodiment of the present invention.

FIG. 9 depicts a simulation result obtained by using the LD drive circuit according to the first embodiment of the present invention. A waveform of the input voltage to the differential-voltage-signal input terminal 23a (positive-phase input terminal) shown in FIGS. 2 and 3 is shown in the uppermost chart of FIG. 9, a waveform of the output current from the negative-phase output terminal 24b shown in FIGS. 2 and 3 is shown in the middle chart of FIG. 9, and a waveform of the Vds50 is shown in the lowermost chart of FIG. 9.

With the LD drive circuit according to the first embodiment, it is found that a convergence time of the waveform of the output current shown in the middle chart of FIG. 9 is about 8 nanoseconds, which is a value sufficiently shorter than the rise time shown in FIG. 7. As explained above with reference to FIGS. 4 and 5, because the bias current to the LD 1 is converted into the light waveform, the time required for the output light of the LD 1 to be stabilized is reduced from about 110 nanoseconds to about 8 nanoseconds, improving the transmission efficiency accordingly. Furthermore, although the rise time of the waveform shown in the uppermost chart of FIG. 9 is shorter than the rise time of the waveform shown in the uppermost chart of FIG. 7, even when such an input voltage is input, the rise time of the LD 1 can be reduced with the configuration according to the first embodiment as compared to a conventional technique.

As described above, the LD drive circuit according to the first embodiment includes the LD 1, the bias-current drive circuit 41, the modulation-current drive circuit 40, the first inductance 2 connected between the anode side of the LD 1 and the positive power source 30, the second inductance 3 connected between the cathode side of the LD 1 and the negative-phase output terminal 24b of the bias-current drive circuit 41, the first resistor 4 with one end connected to the connection point N1 and the other end connected to the negative-phase output terminal 21b of the modulation-current drive circuit 40, and the second resistor 5 with one end connected to the connection point between the cathode of the LD 1 and the second inductance 3 and the other end connected to the positive-phase output terminal 21a of the modulation-current drive circuit 40, and the positive-phase output terminal 24a of the bias-current drive circuit 41 is connected to the connection point N1. Therefore, the inversion time of the Vds50 caused by the reverse voltage of the first inductance 2, that is, the time required to the output light of the LD 1 to be stabilized, is reduced as compared to the conventional one, and as a result, a highly-efficient transmission can be achieved in the PON system.

Second Embodiment

Figure 10:
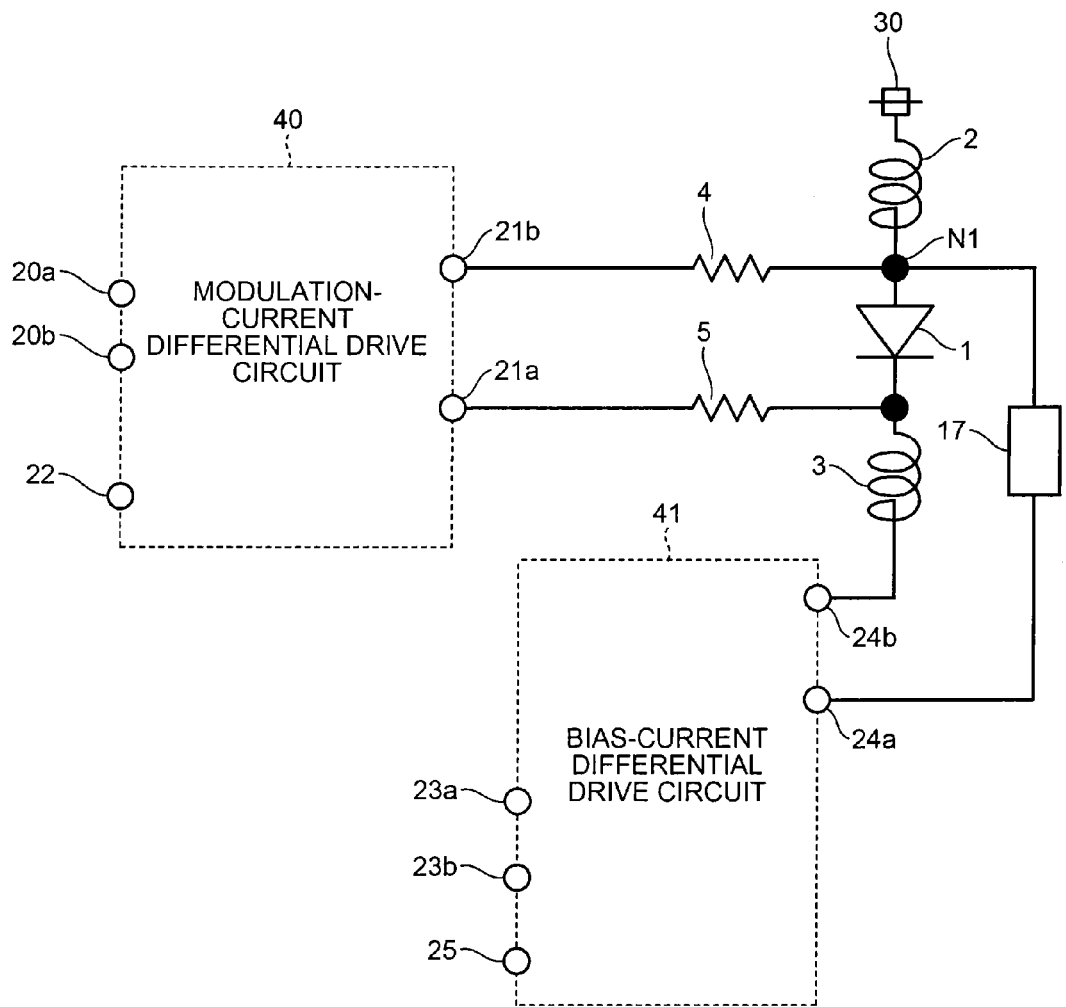
FIG. 10 depicts a configuration of an LD drive circuit according to a second embodiment of the present invention.
Figure 11:
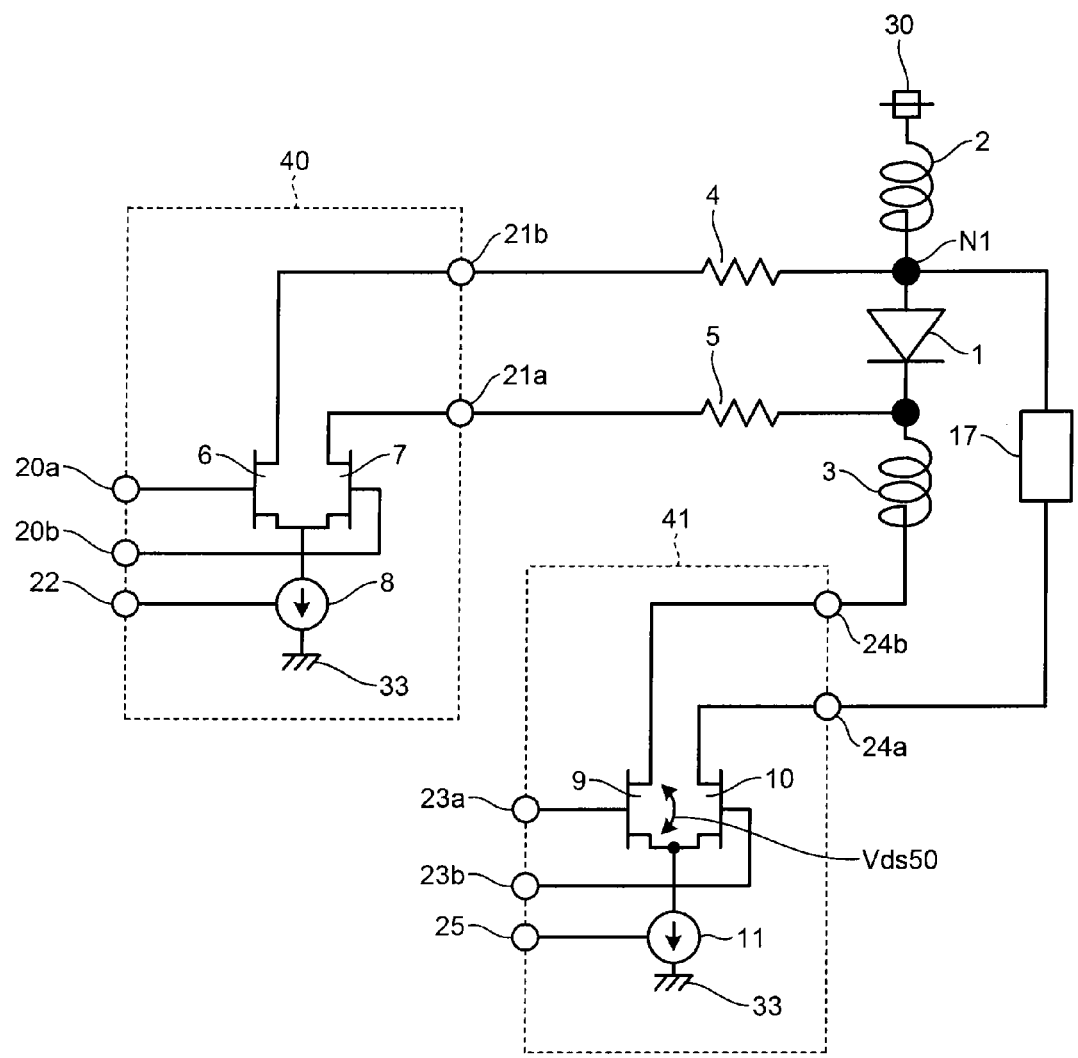
FIG. 11 depicts a reference example of a modulation-current differential drive circuit and a bias-current differential drive circuit shown in FIG. 10.

FIG. 10 depicts a configuration of an LD drive circuit according to a second embodiment of the present invention, and FIG. 11 depicts a reference example of the modulation-current drive circuit 40 and the bias-current differential drive circuit 41 shown in FIG. 10. The LD drive circuit shown in FIGS. 10 and 11 includes an impedance element 17 connected between the positive-phase output terminal 24a of the bias-current drive circuit 41 and the connection point N1, and having an impedance characteristic in a broad frequency range from a low frequency to a high frequency, in addition to the constituent elements having same reference signs and identical functions as those in the LD drive circuit according to the first embodiment. That is, the LD drive circuit according to the second embodiment is configured to improve the high frequency characteristic, while the LD drive circuit according to the first embodiment is configured such that the positive-phase output terminal 24a of the bias-current drive circuit 41 is electrically connected to the connection point N1.

More specifically, similarly to the second inductance 3, the impedance element 17 is configured to increase the output impedance of the bias-current drive circuit 41 to suppress the flow of the modulation current from the modulation-current drive circuit 40 into the bias-current drive circuit 41. In this manner, by arranging the second inductance 3 and the impedance element 17, the high frequency characteristic is even more improved than the LD drive circuit according to the first embodiment. The operation of the LD drive circuit according to the second embodiment is explained below. The bias signal input to the differential-voltage-signal input terminals 23a and 23b is taken in the bias-current drive circuit 41 as the bias current, and the bias current from the bias-current drive circuit 41 is supplied to the LD 1 via the second inductance 3 and the impedance element 17.

As described above, the LD drive circuit according to the second embodiment includes the LD 1, the bias-current drive circuit 41, the modulation-current drive circuit 40, the first inductance 2 connected between the anode side of the LD 1 and the positive power source 30, the second inductance 3 connected between the cathode side of the LD 1 and the negative-phase output terminal 24b of the bias-current drive circuit 41, the first resistor 4 with one end connected to the connection point N1 and the other end connected to the negative-phase output terminal 21b of the modulation-current drive circuit 40, the second resistor 5 with one end connected to the connection point between the cathode of the LD 1 and the second inductance 3 and the other end connected to the positive-phase output terminal 21a of the modulation-current drive circuit 40, and the impedance element 17 connected between the connection point N1 and the positive-phase output terminal 24a of the bias-current drive circuit 41. Therefore, the LD drive circuit according to the second embodiment has the effect of further improving the high frequency characteristic, in addition to the effects of the LD drive circuit according to the first embodiment.

Third Embodiment

Figure 12:
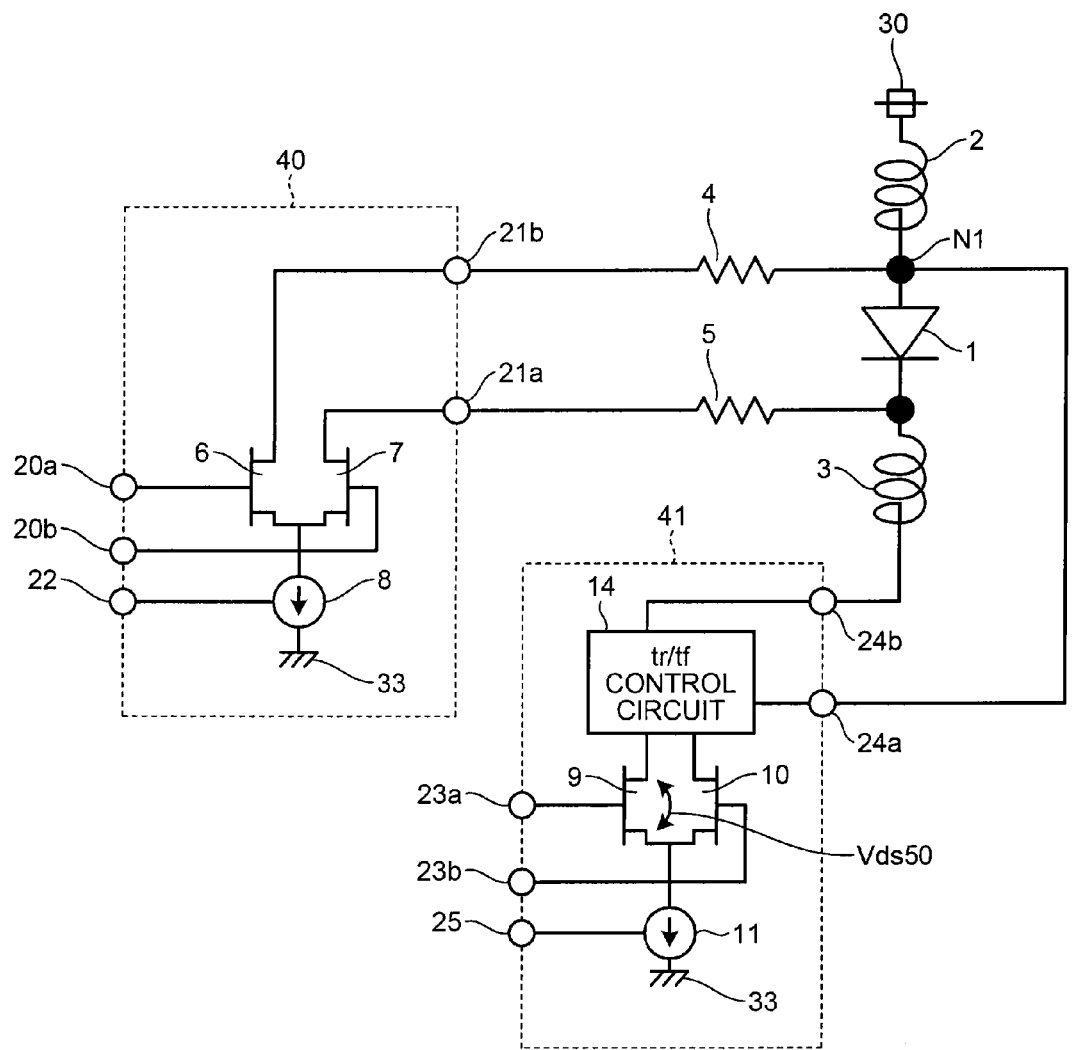
FIG. 12 is a configuration example of an LD drive circuit according to a third embodiment of the present invention.
Figure 13:
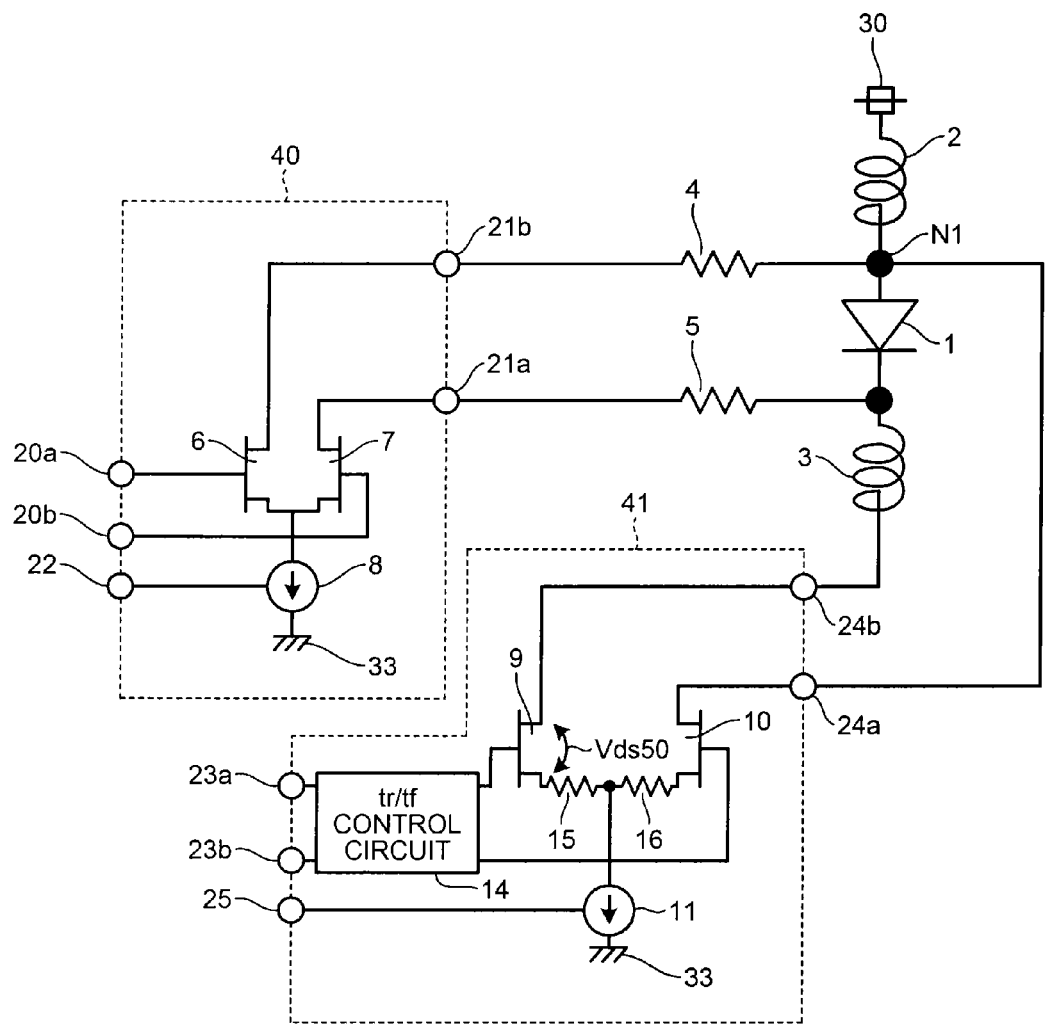
FIG. 13 is another configuration example of the LD drive circuit according to the third embodiment of the present invention.

FIG. 12 is a configuration example of an LD drive circuit according to a third embodiment of the present invention, and FIG. 13 is another example of the LD drive circuit according to the third embodiment of the present invention. With the recent advancement in the downsizing of the semiconductor process the withstand voltage of the transistor has been decreased in recent years, and when the output potential of the bias-current drive circuit 41 is decreased from the positive power source 30 to close to the negative power source 33, the output potential may exceed the withstand voltage of the transistor, causing a problem that the reliability in the withstand voltage of the transistor can be hardly secured. The LD drive circuit according to the third embodiment is configured to solve such a problem, in addition to having effects as those of the first embodiment. Parts of the LD circuit that are identical to those of the LD drive circuit according to the first embodiment are denoted by same reference signs, explanations thereof will be omitted, and only different features are explained below.

The LD drive circuit shown in FIG. 12 is explained first. The LD drive circuit shown in FIG. 12 includes a tr/tf control circuit 14 that controls a tr/tf (rise/fall) characteristic of the bias current, as well as the constituent elements having same reference signs and identical functions as those in the LD drive circuit according to the first embodiment. More specifically, in the bias-current drive circuit 41 shown in FIG. 12, the tr/tf control circuit 14 is connected between the positive-phase output terminal 24a and the negative-phase output terminal 24b of the bias-current drive circuit 41 and the drains of the third MOS transistor 9 and the fourth MOS transistor 10.

The operation of the LD drive circuit shown in FIG. 12 is explained below. The bias signal input to the differential-voltage-signal input terminals 23a and 23b is taken in the tr/tf control circuit 14 as the bias current, and the tr/tf characteristic of the bias current is relaxed by the tr/tf control circuit 14. The bias current from the third MOS transistor 9 is supplied to the LD 1 via the second inductance 3. In this manner, the LD drive circuit shown in FIG. 12 is configured such that the magnitude of the reverse voltage caused by the first inductance 2 is reduced by relaxing the rise and the fall of the bias current by using the tr/tf control circuit 14.

The LD drive circuit shown in FIG. 13 is explained next. The LD drive circuit shown in FIG. 13 includes the tr/tf control circuit 14 that controls a tr/tf characteristic of the input voltage (bias signal) and a third resistor 15 and a fourth resistor 16 for broadening a linear operating area of the differential circuit, in addition to the constituent elements having like reference signs and identical functions as those in the LD drive circuit according to the first embodiment. More specifically, in the bias-current drive circuit 41 shown in FIG. 13, the tr/tf control circuit 14 is connected between the differential-voltage-signal input terminals 23a and 23b of the bias-current drive circuit 41 and the gates of the third MOS transistor 9 and the fourth MOS transistor 10, and the third resistor 15 and the fourth resistor 16 are connected in series to form a series resistance with one end connected to the source of the third MOS transistor 9 and the other end connected to the source of the fourth MOS transistor 10. Furthermore, the current source 11 that supplies the current determined by the set value from the bias-current setting terminal 25 is provided between a connection point of the series resistance and the negative power source 33.

The operation of the LD drive circuit shown in FIG. 13 is explained below. The bias signal input to the differential-voltage-signal input terminals 23a and 23b is taken in the tr/tf control circuit 14, the tr/tf characteristic of the bias signal is relaxed by the tr/tf control circuit 14, and then the bias signal is input to the third MOS transistor 9 and the fourth MOS transistor 10. Further, the linear operating area of the differential circuit is broadened due to the third resistor 15 and the fourth resistor 16, thus the input/output characteristics of the third MOS transistor 9 and the fourth MOS transistor 10 are relieved. The bias current from the third MOS transistor 9 is supplied to the LD 1 via the second inductance 3. In this manner, the LD drive circuit shown in FIG. 13 is configured such that the magnitude of the back electromotive force caused by the first inductance 2 is reduced by relieving the rise and the fall of the bias signal by using the tr/tf control circuit 14, the third resistor 15, and the fourth resistor 16.

Figure 14:
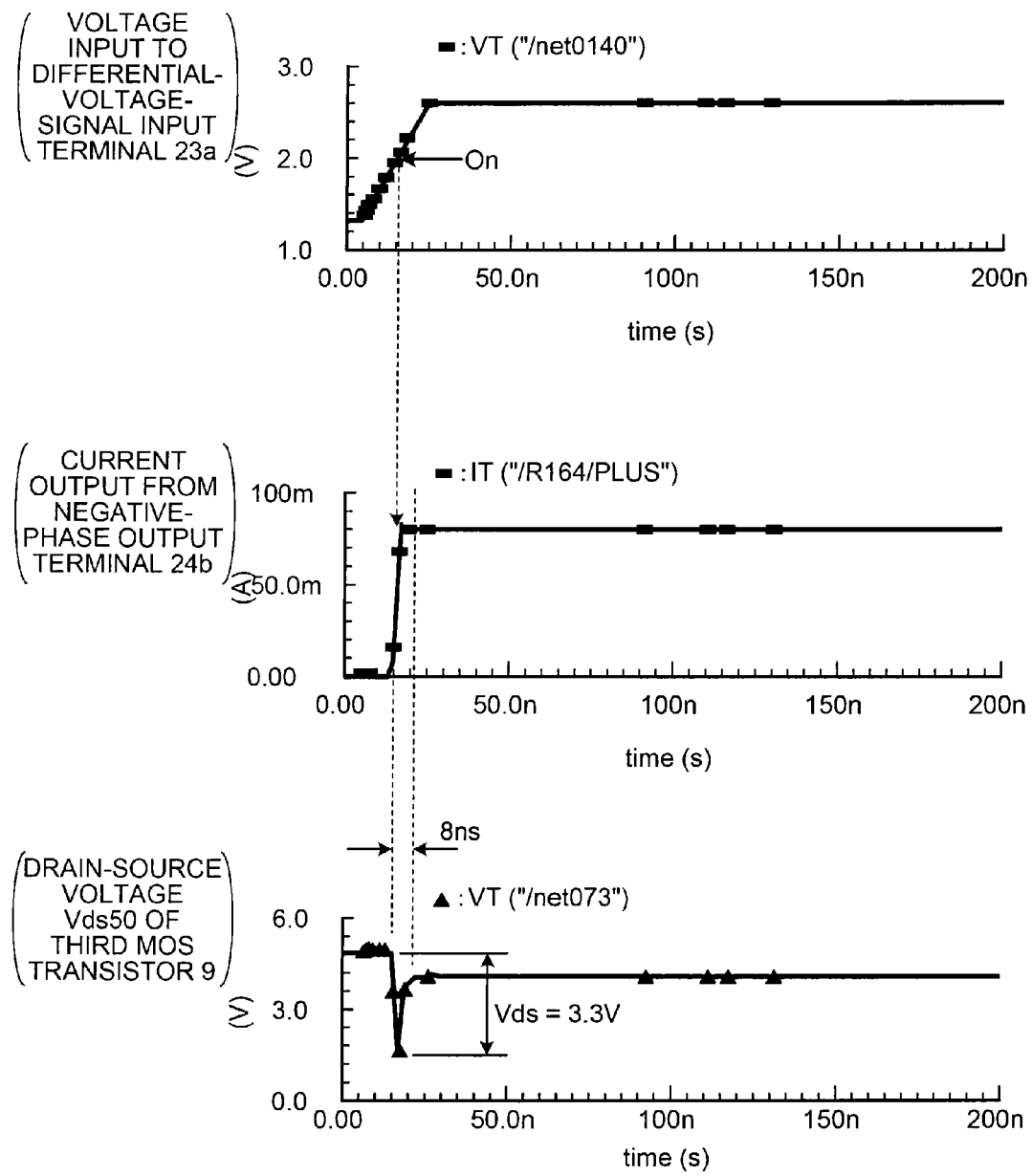
FIG. 14 depicts a simulation result obtained by using the LD drive circuit according to the third embodiment of the present invention.

FIG. 14 depicts a simulation result obtained by using the LD drive circuit according to the third embodiment of the present invention. A waveform of the input voltage to the differential-voltage-signal input terminal 23a (positive-phase input terminal) shown in FIGS. 12 and 11 is shown in the uppermost chart of FIG. 14, a waveform of the output current from the negative-phase output terminal 24b shown in FIGS. 12 and 11 is shown in the middle chart of FIG. 14, and a waveform of the Vds50 of the third MOS transistor 9 is shown in the lowermost chart of FIG. 14.

With the LD drive circuit according to the third embodiment, it is found that a convergence time of the waveform of the output current shown in the middle chart of FIG. 14 is about 8 nanoseconds, similarly to the LD drive circuit according to the first embodiment, and the value of the Vds50 shown in the lowermost chart of FIG. 14 is improved from 3.8 volts to 3.3 volts. Although the recent advancement in the downsizing of the semiconductor process has been remarkable, because the downsizing of the semiconductor process and the decrease of the withstand voltage have a tradeoff relationship, the reduction of the value of the Vds50 to a value lower than 3.8 volts can improve the reliability on the withstand voltage. In this manner, the third embodiment is capable of not only achieving the LD drive circuit with which the reliability of the withstand voltage of the transistor can be easily secured but also increasing the lifetime of the transistor.

Fourth embodiment

Figure 15:
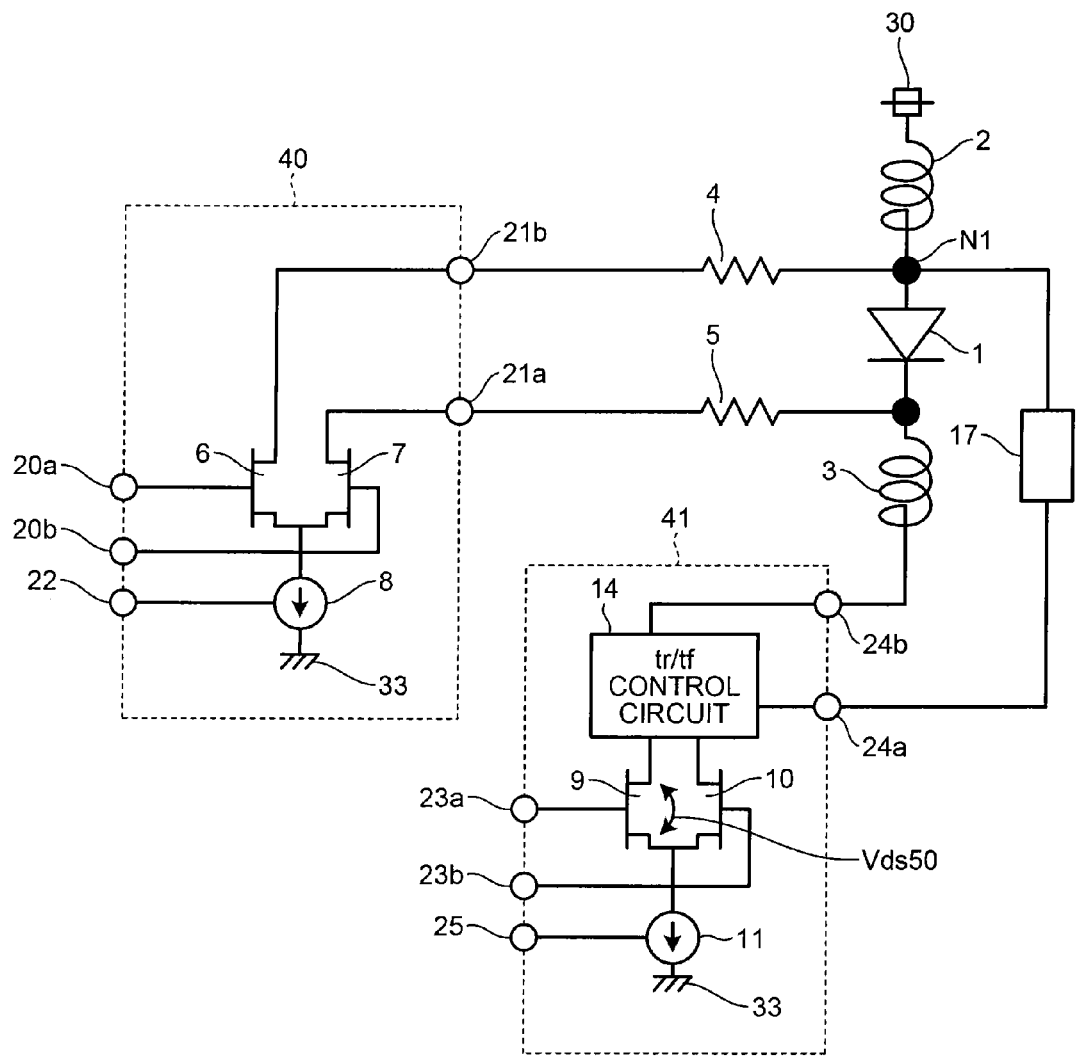
FIG. 15 is a configuration example of an LD drive circuit according to a fourth embodiment of the present invention.
Figure 16:
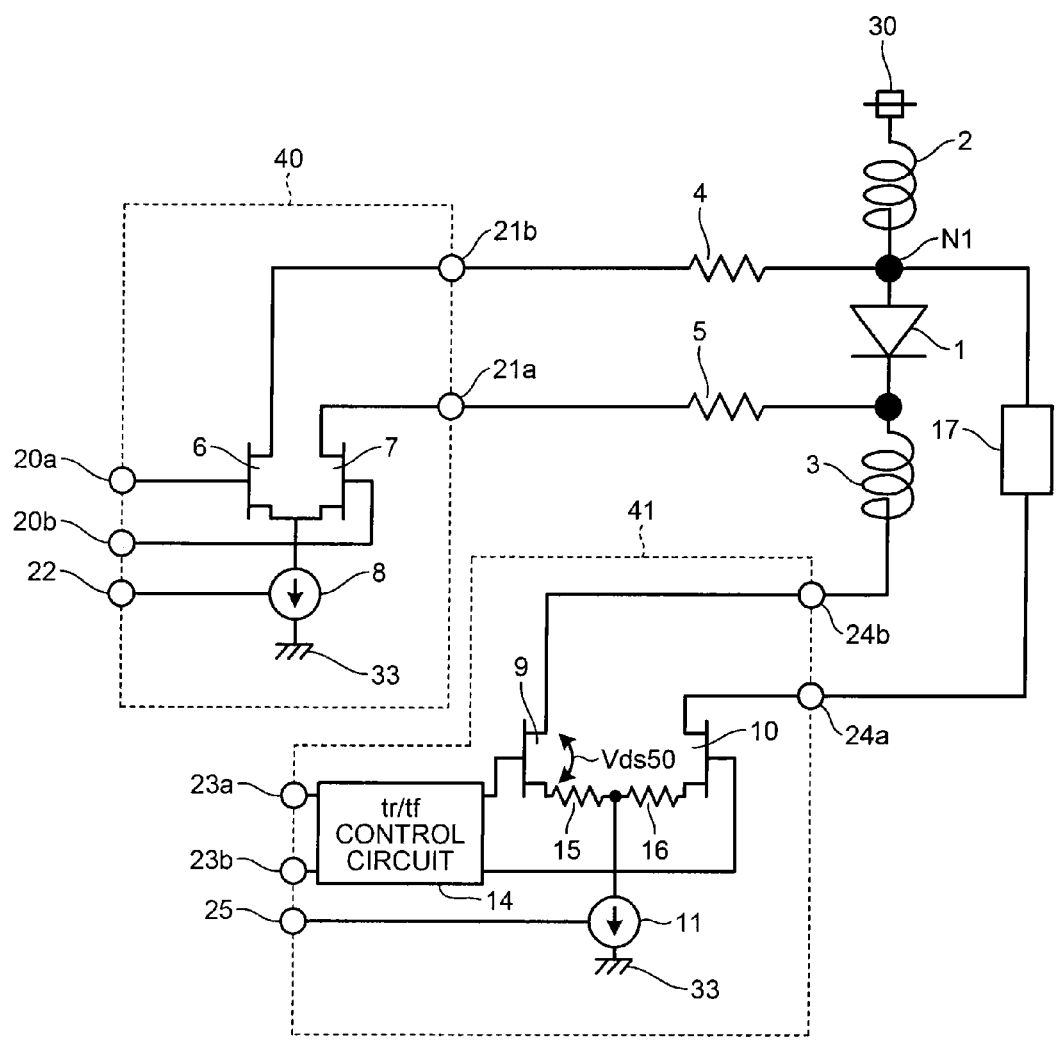
FIG. 16 is another configuration example of the LD drive circuit according to the fourth embodiment of the present invention.

FIG. 15 is a configuration example of an LD drive circuit according to a fourth embodiment of the present invention, and FIG. 16 is another configuration example of the LD drive circuit according to the fourth embodiment of the present invention. The LD drive circuits shown in FIGS. 15 and 16 include the impedance element 17 connected between the positive-phase output terminal 24a of the bias-current drive circuit 41 and the connection point N1, as well as the constituent elements having same reference signs and identical functions as those in the LD drive circuit according to the third embodiment. That is, the LD drive circuit according to the fourth embodiment is configured to improve the high frequency characteristic, while the LD drive circuit according to the third embodiment is configured such that the positive-phase output terminal 24a of the bias-current drive circuit 41 is electrically connected to the connection point N1.

More specifically, similarly to the second inductance 3, the impedance element 17 is configured to increase the output impedance of the bias-current drive circuit 41 to suppress the flow of the modulation current from the modulation-current drive circuit 40 into the bias-current drive circuit 41. In this manner, by arranging the second inductance 3 and the impedance element 17, the high frequency characteristic is even more improved than the LD drive circuit according to the third embodiment. The operation of the LD drive circuit according to the fourth embodiment is explained below. The bias signal input to the differential-voltage-signal input terminals 23a and 23b is taken in the bias-current drive circuit 41 as the bias current, and the bias current from the bias-current drive circuit 41 is supplied to the LD 1 via the second inductance 3 and the impedance element 17.

As explained above, the LD drive circuit according to the fourth embodiment includes the LD 1, the bias-current drive circuit 41 similarly to the bias-current drive circuit 41 according to the third embodiment, the modulation-current drive circuit 40, the first inductance 2 connected between the anode side of the LD 1 and the positive power source 30, the second inductance 3 connected between the cathode side of the LD 1 and the negative-phase output terminal 24b of the bias-current drive circuit 41, the first resistor 4 with one end connected to the connection point N1 and the other end connected to the negative-phase output terminal 21b of the modulation-current drive circuit 40, the second resistor 5 with one end connected to the connection point between the cathode of the LD 1 and the second inductance 3 and the other end connected to the positive-phase output terminal 21a of the modulation-current drive circuit 40, and the impedance element 17 connected between the connection point N1 and the positive-phase output terminal 24a of the bias-current drive circuit 41. Therefore, the LD drive circuit according to the fourth embodiment has the effect of further improving the high frequency characteristic, in addition to the effects of the LD drive circuit according to the third embodiment.

The LD drive circuit according to the first to fourth embodiments may be configured as explained below. Parts of the LD circuit explained below that are identical to those of the LD drive circuit according to the first to fourth embodiments are denoted by same reference signs, explanations thereof will be omitted, and only different features are explained below.

Figure 17:
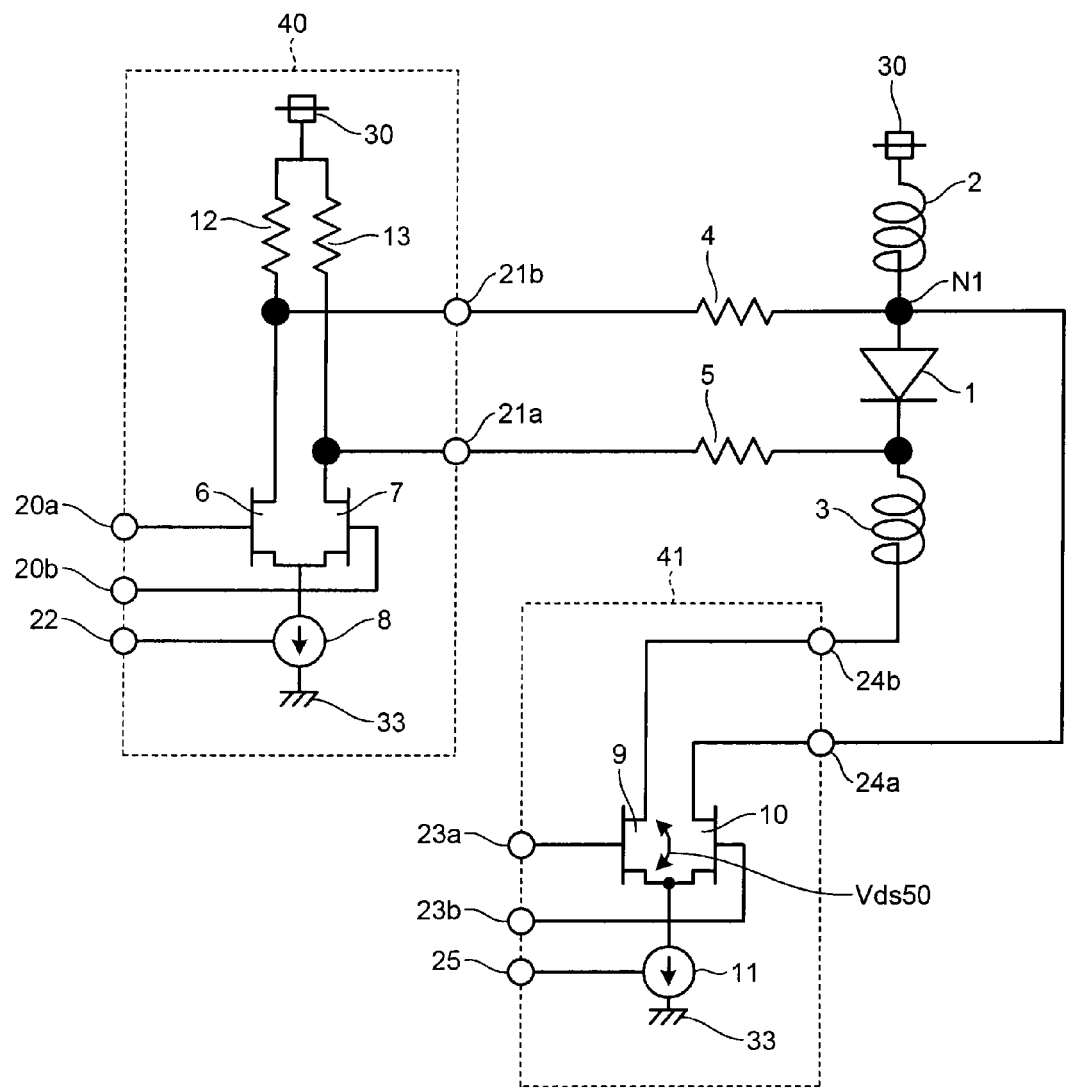
FIG. 17 is another configuration example of a modulation-current differential drive circuit described in the first and third embodiments of the present invention.
Figure 18:
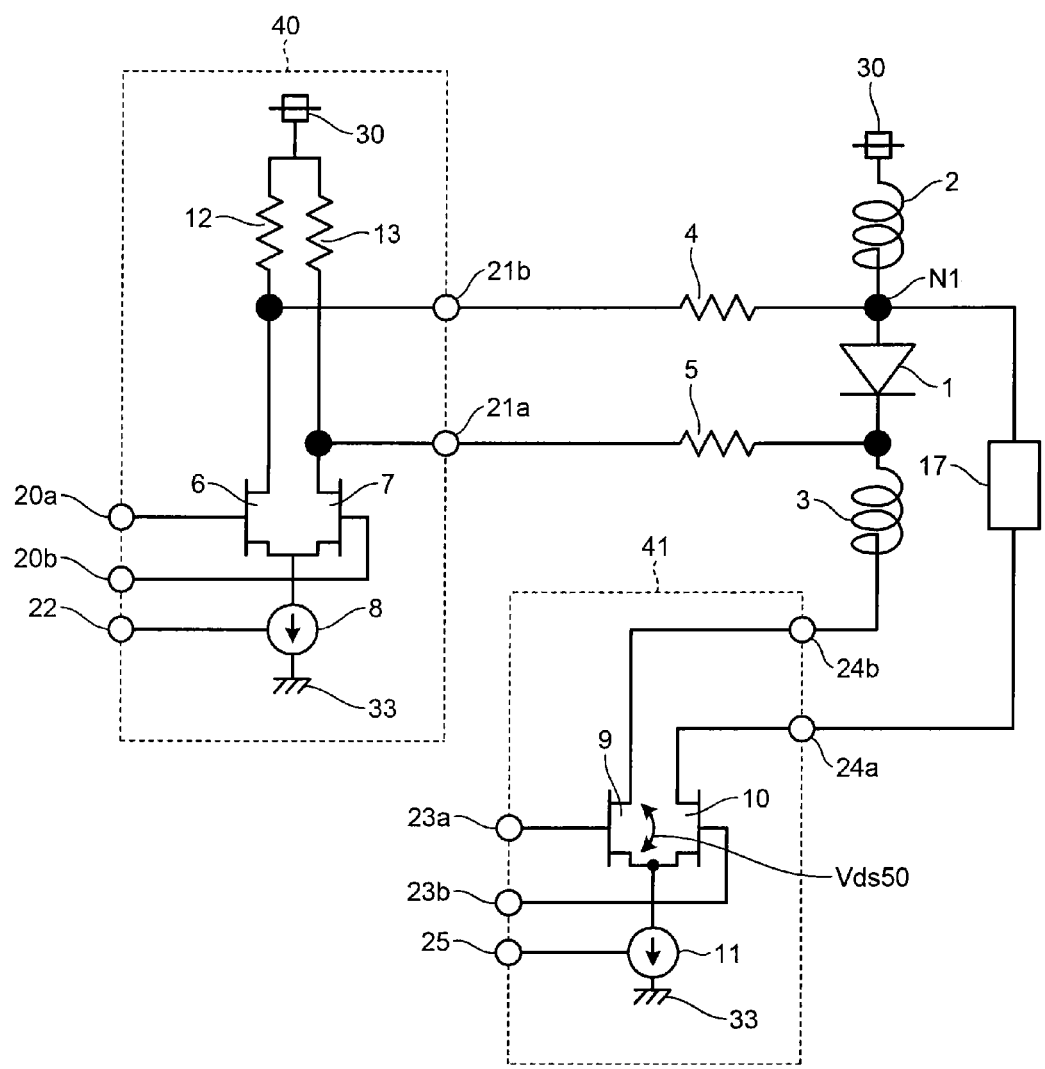
FIG. 18 is another configuration example of a modulation-current differential drive circuit described in the second and fourth embodiments of the present invention.

FIG. 17 is another configuration example of the modulation-current drive circuit 40 described in the first and third embodiments of the present invention, FIG. 18 is another configuration example of the modulation-current drive circuit 40 described in the second and fourth embodiments of the present invention. The modulation-current drive circuits 40 shown in FIGS. 17 and 18 include the first MOS transistor 6, the second MOS transistor 7, the current source 8, the fifth resistor 12 with one end connected to the first MOS transistor 6 and the other end connected to the positive power source 30, and the sixth resistor 13 with one end connected to the second MOS transistor 7 and the other end connected to the positive power source 30. The fifth resistor 12 and the sixth resistor 13 function as bias resistors.

Even with the arrangement of the fifth resistor 12 and the sixth resistor 13 between the drains of the first MOS transistor 6 and the second MOS transistor 7 and the power source 30 in the above manner, operations and effects are identical to those of the LD drive circuits according to the first to fourth embodiments.

The same power source as the positive power source 30 connected to the other end of the first inductance 2 is supplied to the modulation-current drive circuits 40 shown in FIGS. 17 and 18. It is assumed that the positive power source 30 of the modulation-current drive circuit 40 is connected to the positive power source 30 for the first inductance 2 with a low impedance. By commonly connecting the positive power source 30 supplied to the modulation-current drive circuit 40 and the positive power source 30 connected to the first inductance 2 in the above manner, the high frequency characteristic can be improved.

The transistor that is applicable to the LD drive circuits according to the first to fourth embodiments of the present invention is not limited to the MOS transistor, but a bipolar transistor can be used instead. In this case, the source described in the first to fourth embodiments can be read as an emitter, and similarly, the gate can be read as a base, and the drain can be read as a collector.

Figure 19:
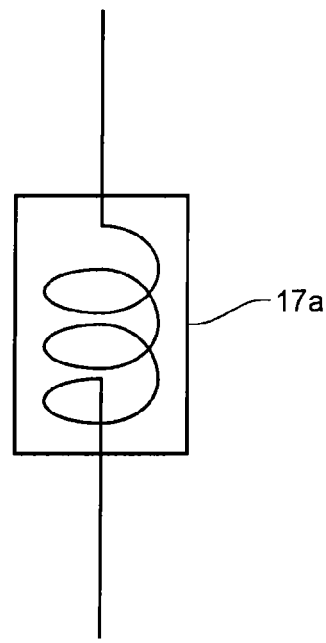
FIG. 19 is an example of a case where an impedance element described in the second and fourth embodiments is configured as an inductance.
Figure 20:
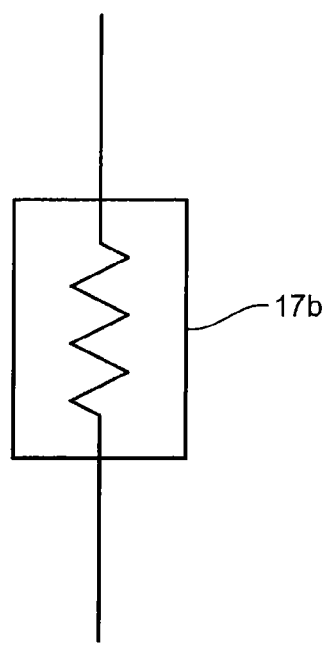
FIG. 20 is an example of a case where the impedance element described in the second and fourth embodiments is configured as a resistor.
Figure 21:
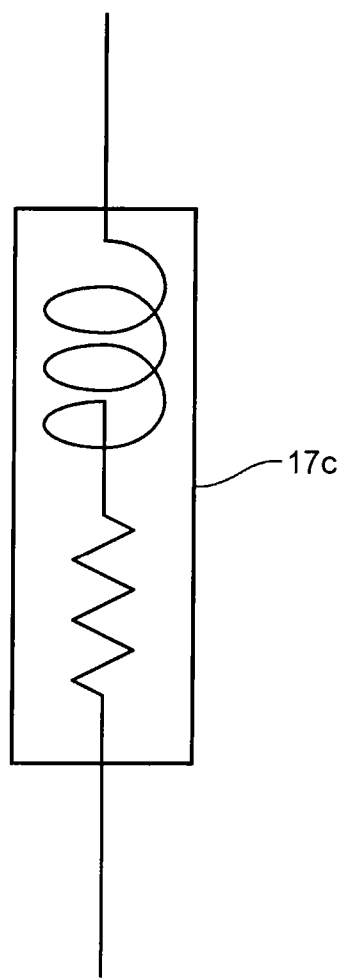
FIG. 21 is an example of a case where the impedance element described in the second and fourth embodiments is configured as a series circuit of an inductance and a resistor.

FIG. 19 is an example of a case where the impedance element 17 described in the second and fourth embodiments is configured as an inductance 17a, FIG. 20 is an example of a case where the impedance element 17 described in the second and fourth embodiments is configured as a resistor 17b, and FIG. 21 is an example of a case where the impedance element 17 described in the second and fourth embodiments is configured as a series circuit 17c of an inductance and a resistor. All the inductance 17a, the resistor 17b, and the series circuit 17c have an impedance characteristic in a broad frequency range from a low frequency to a high frequency. Therefore, by configuring the impedance element 17 with any one of the inductance 17a, the resistor 17b, and the series circuit 17c, the output impedance of the bias-current drive circuit 41 can be increased. As a result, the modulation current from the modulation-current drive circuit 40 is suppressed from flowing into the bias-current drive circuit 41, and the high frequency characteristic is even more improved.

The LD drive circuits according to the first to fourth embodiments are only examples of the contents of the present invention and can be combined with other well-known techniques. It is needless to mention that the present invention can be configured while modifying it without departing from the scope of the invention, such as omitting a part the configuration.

INDUSTRIAL APPLICABILITY

As described above, the present invention is applicable to an ONU of a PON system, and particularly useful as an invention that can improve the transmission efficiency of the PON system.

REFERENCE SIGNS LIST

1 LD
2 first inductance
3 second inductance
4 first resistor
5 second resistor
6 first MOS transistor
7 second MOS transistor
8, 11 current source
9 third MOS transistor
10 fourth MOS transistor
12 fifth resistor
13 sixth resistor
14 tr/tf control circuit
15 third resistor
16 fourth resistor
17 impedance element
17a inductance
17b resistor
17c series circuit
20a, 20b modulation-voltage-signal input terminal
21a, 24a positive-phase output terminal
21b, 24b negative-phase output terminal
22 modulation-current setting terminal
23a, 23b differential-voltage-signal input terminal
25 differential-voltage-signal input terminal
30, 31, 32 positive power source
33 negative power source
40 modulation-current differential drive circuit (modulation-current drive circuit)
41 bias-current differential drive circuit (bias-current drive circuit)
1-1 to 1-n packet from ONU
N1 connection point of anode of LD and first inductance
Vds1, Vds50 drain-source voltage of third MOS transistor 9

The invention claimed is:
1. A laser diode driver circuit comprising:
a laser diode that converts a current signal into an optical signal;
a bias-current drive circuit that supplies a bias current to the laser diode;
a modulation-current drive circuit that supplies a modulation current to the laser diode;
a first inductance connected between the anode of the laser diode and a positive power source;

a second inductance connected between the cathode of the laser diode and a negative-phase output terminal of the bias-current drive circuit;

a first resistor with one end connected to a connection point of the anode of the laser diode and the first inductance and the other end connected to a negative-phase output terminal of the modulation-current drive circuit; and a second resistor including one end connected to a connection point of the cathode of the laser diode and the second inductance and the other end connected to a positive-phase output terminal of the modulation-current drive circuit, wherein a positive-phase output terminal of the bias-current drive circuit is connected to the connection point of the anode of the laser diode and the first inductance.

2. A laser diode driver circuit comprising:

a laser diode that converts a current signal into an optical signal;

a bias-current drive circuit that supplies a bias current to the laser diode;

a modulation-current drive circuit that supplies a modulation current to the laser diode;

a first inductance connected between the anode of the laser diode and a positive power source;

a second inductance connected between the cathode of the laser diode and a negative-phase output terminal of the bias-current drive circuit;

a first resistor with one end connected to a connection point of the anode of the laser diode and the first inductance and the other end connected to a negative-phase output terminal of the modulation-current drive circuit;

a second resistor with one end connected to a connection point of the cathode of the laser diode and the second inductance and the other end connected to a positive-phase output terminal of the modulation-current drive circuit; and an impedance element connected between the connection point of the anode of the laser diode and the first inductance and a positive-phase output terminal of the bias-current drive circuit.

3. The laser diode driver circuit according to claim 2, wherein the modulation-current drive circuit includes a first transistor and a second transistor constituting a differential circuit driven by two complementary input signals, and a first current source provided between a connection point of a source or an emitter of the first transistor and a source or an emitter of the second transistor and a negative power source and configured to supply a current determined by a predetermined set value, and the bias-current drive circuit includes a third transistor and a fourth transistor constituting a differential circuit driven by two complementary input signals, and a second current source provided between a connection point of a source or an emitter of the third transistor and a source or an emitter of the fourth transistor and the negative power source, drains or collectors of the first transistor and the second transistor are configured to respectively output a positive-phase output and a negative-phase output of the modulation-current drive circuit, and drains or collectors of the third transistor and the fourth transistor are configured to respectively output a positive-phase output and a negative-phase output of the bias-current drive circuit.

4. The laser diode driver circuit according to claim 3, wherein the bias-current drive circuit includes the positive-phase output terminal and the negative-phase output terminal of the bias-current drive circuit, and a control circuit that is provided between the drains or the collectors of the third transistor and the fourth transistor and configured to control a rise time and a fall time of the bias current.

5. The laser diode driver circuit according to claim 3, wherein the bias-current drive circuit includes a control circuit that is provided between input signal terminals of the bias-current drive circuit and gates or bases of the third transistor and the fourth transistor and configured to control a rise time and a fall time of the input signals, and a series resistance configured by a third resistor and a fourth resistor connected in series and having one end connected to the source or the emitter of the third transistor and the other end connected to the source or the emitter of the fourth transistor, and the second current source is provided between a connection point of the third resistor and the fourth resistor and the negative power source.

6. The laser diode driver circuit according to claim 3, wherein the modulation-current drive circuit further includes a fifth resistor including one end connected to the first transistor and the other end connected to a positive power source, and a sixth resistor including one end connected to the second transistor and the other end connected to the positive power source.

7. The laser diode driver circuit according to claim 6, wherein the positive power source is supplied from the positive power source connected to the first inductance.

8. The laser diode driver circuit according to claim 1, wherein the modulation-current drive circuit includes a first transistor and a second transistor constituting a differential circuit driven by two complementary input signals, and a first current source provided between a connection point of a source or an emitter of the first transistor and a source or an emitter of the second transistor and a negative power source and configured to supply a current determined by a predetermined set value, and the bias-current drive circuit includes a third transistor and a fourth transistor constituting a differential circuit driven by two complementary input signals, and a second current source provided between a connection point of a source or an emitter of the third transistor and a source or an emitter of the fourth transistor and the negative power source, drains or collectors of the first transistor and the second transistor are configured to respectively output a positive-phase output and an negative-phase output of the modulation-current drive circuit, and drains or collectors of the third transistor and the fourth transistor are configured to respectively output a positive-phase output and a negative-phase output of the bias-current drive circuit.

9. The laser diode driver circuit according to claim 8, wherein
the bias-current drive circuit includes
the positive-phase output terminal and the negative-phase output terminal of the bias-current drive circuit, and
a control circuit that is provided between the drains or the collectors of the third transistor and the fourth transistor and configured to control a rise time and a fall time of the bias current.

10. The laser diode driver circuit according to claim 8, wherein
the bias-current drive circuit includes
a control circuit that is provided between input signal terminals of the bias-current drive circuit and gates or bases of the third transistor and the fourth transistor and configured to control a rise time and a fall time of the input signals, and
a series resistance configured by a third resistor and a fourth resistor connected in series and having one end connected to the source or the emitter of the third transistor and the other end connected to the source or the emitter of the fourth transistor, and
the second current source is provided between a connection point of the third resistor and the fourth resistor and the negative power source.

11. The laser diode driver circuit according to claim 8, wherein
the modulation-current drive circuit further includes
a fifth resistor including one end connected to the first transistor and the other end connected to a positive power source, and
a sixth resistor including one end connected to the second transistor and the other end connected to the positive power source.

12. The laser diode driver circuit according to claim 11, wherein the positive power source is supplied from the positive power source connected to the first inductance.

* * * * *